United States Patent
Park

(10) Patent No.: US 11,192,356 B2
(45) Date of Patent: Dec. 7, 2021

(54) INK JET PRINTING SYSTEM

(71) Applicant: Semes Co., Ltd., Cheonan-si (KR)

(72) Inventor: Taehyun Park, Seongnam-si (KR)

(73) Assignee: Semes Co., Ltd., Cheonan-si (KR)

(*) Notice: Subject to any disclaimer, the term of this patent is extended or adjusted under 35 U.S.C. 154(b) by 36 days.

(21) Appl. No.: 16/903,739

(22) Filed: Jun. 17, 2020

(65) Prior Publication Data

US 2021/0001625 A1    Jan. 7, 2021

(30) Foreign Application Priority Data

Jul. 3, 2019    (KR) .................. 10-2019-0079761

(51) Int. Cl.
*B41J 2/045* (2006.01)
*B41J 3/407* (2006.01)

(52) U.S. Cl.
CPC ........... *B41J 2/04505* (2013.01); *B41J 3/407* (2013.01)

(58) Field of Classification Search
CPC ............... B41J 2/04505; B41J 2/04586; B41J 2/16526; B41J 2/16508; B41J 2/01; B41J 3/407; B41J 2/04503; B41J 2/04508; B41J 2/0451; B41J 2/04513; B41J 2/04526; B41J 2/04506; B41J 2/04558; B41J 2/12; B41J 2/125; B41J 2/04561; B41J 2/2135;

(Continued)

(56) References Cited

U.S. PATENT DOCUMENTS

| 5,627,571 A * | 5/1997 | Anderson | B41J 2/125 347/19 |
| 2010/0245455 A1* | 9/2010 | Mizes | B41J 2/2135 347/19 |

(Continued)

FOREIGN PATENT DOCUMENTS

| KR | 10-1065977 B1 | 9/2011 |
| KR | 10-2017-0004866 A | 1/2017 |

(Continued)

*Primary Examiner* — Kristal Feggins
(74) *Attorney, Agent, or Firm* — Daly Crowley Mofford & Durkee, LLP

(57) ABSTRACT

The ink jet printing system may have a printing section and a testing section. The ink jet printing system may include a first alignment mark disposed in the printing section along a first direction, a second alignment mark disposed in the testing section along a second direction perpendicular to the first direction, an ink jet head for providing chemical liquid onto a substrate, a first identification member proximate to the ink jet head, the first identification member identifying the first alignment mark and the second alignment mark, a gantry for moving the ink jet head between the printing section and the testing section, a second identification member proximate to the gantry, the second identification member identifying discharging points of the chemical liquid in the testing section, and a control member for correcting discharging points of the chemical liquid discharged from the ink jet head onto the substrate in the printing section based on a result that the second identification member identifies the discharging points of the chemical liquid in the testing section. The testing section may be arranged in substantially parallel with the printing section along the first direction.

20 Claims, 4 Drawing Sheets

(58) Field of Classification Search
CPC .......... B41J 11/008; B41J 29/393; B41J 3/46; H01L 21/02288; H01L 51/0005; G02F 1/1303
See application file for complete search history.

(56) References Cited

U.S. PATENT DOCUMENTS

| | | | | |
|---|---|---|---|---|
| 2013/0222448 A1* | 8/2013 | Donahue | ............. | B41J 2/17553 347/9 |
| 2014/0125749 A1* | 5/2014 | Spence | ................ | B41J 2/16535 347/104 |

FOREIGN PATENT DOCUMENTS

| KR | 10-2018-0092275 A | 8/2018 |
|---|---|---|
| KR | 10-2018-0102489 A | 9/2018 |

* cited by examiner

INK JET PRINTING SYSTEM

CROSS-REFERENCE TO RELATED APPLICATION

This application claims priority to Korean Patent Application No. 10-2019-0079761 filed on Jul. 3, 2019 in the Korean Intellectual Property Office (KIPO), the contents of which are herein incorporated by reference in its entirety.

BACKGROUND

1. Field

Example embodiments of the invention relate to an ink jet printing system. More particularly, example embodiments of the invention relate to an ink jet printing system capable of exactly discharging chemical liquid onto desired pixel regions of a substrate.

2. Related Technology

Recent display devices such as liquid crystal display devices or organic light emitting display devices demand high resolution. To accomplish such a display device having high resolution, a substrate for manufacturing the display device has more pixel regions per unit area. However, the display device having high resolution cannot be accomplished if chemical liquid is not exactly discharged onto dense pixel regions of the substrate. Accordingly, the control of discharging points of chemical liquid provided onto the dense pixel regions of the substrate becomes more important in the processes of manufacturing recent display devices.

SUMMARY

It is an object of the invention to provide an ink jet printing system for exactly providing chemical liquid onto dense pixel regions of a substrate for a display device having a high resolution.

According to one aspect of the invention, there is provided an ink jet printing system having a printing section and a testing section. The ink jet printing system may include a first alignment mark disposed in the printing section along a first direction, a second alignment mark disposed in the testing section along a second direction substantially perpendicular to the first direction, an ink jet head for providing chemical liquid onto a substrate, a first identification member proximate to the ink jet head, the first identification member identifying the first alignment mark and the second alignment mark, a gantry for moving the ink jet head between the printing section and the testing section, a second identification member proximate to the gantry, the second identification member identifying discharging points of the chemical liquid in the testing section, and a control member for correcting discharging points of the chemical liquid discharged from the ink jet head onto the substrate in the printing section based on a result that the second identification member identifies the discharging points of the chemical liquid in the testing section. In this case, the testing section may be arranged in substantially parallel with the printing section along the first direction.

In example embodiments, the testing section may have a width substantially the same as a width of the printing section and the testing section may have a length substantially smaller than a length of the printing section.

In example embodiments, the gantry may move in the first direction and the ink jet head may move along the gantry in the second direction.

In example embodiments, the first identification member may move together with the ink jet head in the first direction and the second direction.

In some example embodiments, the ink jet printing system may include two first identification members and two first alignment marks, and the two first identification members may identify the two first alignment marks as the ink jet head moves in the printing section.

In some example embodiments, the ink jet printing system may include two second alignment marks, and the two first identification members may identify the two second alignment marks as the ink jet head moves in the testing section.

In example embodiments, the second identification member may move in the second direction along the gantry.

In some example embodiments, the ink jet printing system may include two second identification members, and the two first identification members may identify the two second alignment marks as the gantry moves in the testing section.

In example embodiments, the ink jet printing system may additionally include a floating stage for floating the substrate and a transfer member for transferring the substrate disposed in each of the printing section and the testing section.

In other example embodiments, the ink jet printing system may additionally include an auxiliary gantry moving along the first direction in the testing section wherein the second identification member may be proximate to the auxiliary gantry.

In still other example embodiments, the ink jet printing system may additionally include a maintenance section disposed adjacent to the printing section and the testing section.

According to another aspect of the invention, there is provided an ink jet printing system having a printing section and a testing section. The ink jet printing system may include a first alignment mark disposed in the printing section along a first direction, a second alignment mark disposed in the testing section along a second direction substantially perpendicular to the first direction, an ink jet head for providing chemical liquid onto a substrate, a first identification member proximate to the ink jet head, the first identification member identifying the first alignment mark and the second alignment mark, a gantry for moving the ink jet head between the printing section and the testing section, a second identification member proximate to the gantry, the second identification member identifying discharging points of the chemical liquid in the testing section, and a control member controlling a setting of a position of the first identification member for identifying the first alignment mark and the second alignment mark, a setting of a position of the ink jet head based on identifications of the first alignment mark and the second alignment mark, and a setting of a position of the second identification member for identifying the discharging points of the chemical liquid. In this case, the testing section may be arranged in substantially parallel with the printing section along the first direction.

In some example embodiments, the ink jet printing system may include two first identification members and two second alignment marks, and the control member may enable the two first identification members to identify one of the two second alignment marks, and one of the two first identification members to identify the two second alignment marks such that the control member may control the setting of the position of the ink jet head relative to the first direction and the second direction.

In example embodiments, the control member may correct discharging points of the chemical liquid discharged from the ink jet head onto the substrate in the printing section based on a result that the second identification member identifies the discharging points of the chemical liquid in the testing section.

In some example embodiments, the ink jet printing system may additionally include two first alignment marks provided on a first substrate transferred in the printing section along the first direction, and two second alignment marks provided on a second substrate transferred in the printing section along the first direction.

In other example embodiments, the ink jet printing system may additionally include a member for preventing a spread of the chemical liquid provided on the second substrate.

In some example embodiments, the ink jet printing system may additionally include an auxiliary gantry disposed in the testing section along the second direction wherein the second identification member may be proximate to the auxiliary gantry.

In other example embodiments, the ink jet printing system may additionally include a maintenance section disposed adjacent to the printing section and the testing section.

According to still another aspect of the invention, there is provided an ink jet printing system having a printing section and a testing section. The ink jet printing system may include two first alignment marks disposed in the printing section along a first direction; two second alignment marks disposed in the testing section along a second direction substantially perpendicular to the first direction; an ink jet head for providing chemical liquid onto a substrate, two first identification members proximate to the ink jet head, the two first identification members identifying the two first alignment marks and the two second alignment marks, a gantry for moving the ink jet head between the printing section and the testing section, a second identification member proximate to the gantry, the second identification member identifying discharging points of the chemical liquid in the testing section, and a control member. The control member may control a setting of a position of the first identification members for identifying the first alignment marks and the second alignment marks, a setting of a position of the ink jet head based on identifications of the first alignment marks and the second alignment marks, and a setting of a position of the second identification member for identifying the discharging points of the chemical liquid, wherein the control member may correct discharging points of the chemical liquid discharged from the ink jet head onto the substrate in the printing section based on a result that the second identification member identifies the discharging points of the chemical liquid in the testing section. In this case, the testing section may be arranged in substantially parallel with the printing section along the first direction. The gantry may move in the first direction and the ink jet head may move along the gantry in the second direction.

In some example embodiments, the ink jet printing system may additionally include an auxiliary gantry disposed in the testing section along the second direction and a maintenance section disposed adjacent to the printing section and the testing section. Here, the second identification member may be proximate to the auxiliary gantry.

According to example embodiments, the chemical liquid may be exactly discharged onto the substrate in the printing section after the discharging points of the chemical liquid is corrected based on the discharging points of the chemical liquid identified in the testing section. The ink jet printing system may exactly provide the chemical liquid onto dense pixel regions of the substrate such that recent display devices having high resolutions and dense pixels may have reliably accomplished. Additionally, the testing section may be arranged in substantially parallel with the printing section along the first direction such that the increase of the total space of the ink jet printing system including the printing section and the testing section may be efficiently minimized. Moreover, the gantry may have a length substantially corresponding to the width of the printing section and/or the width of the testing section such that the size of the gantry may be reduced and a downward bending of the gantry may be effectively prevented.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
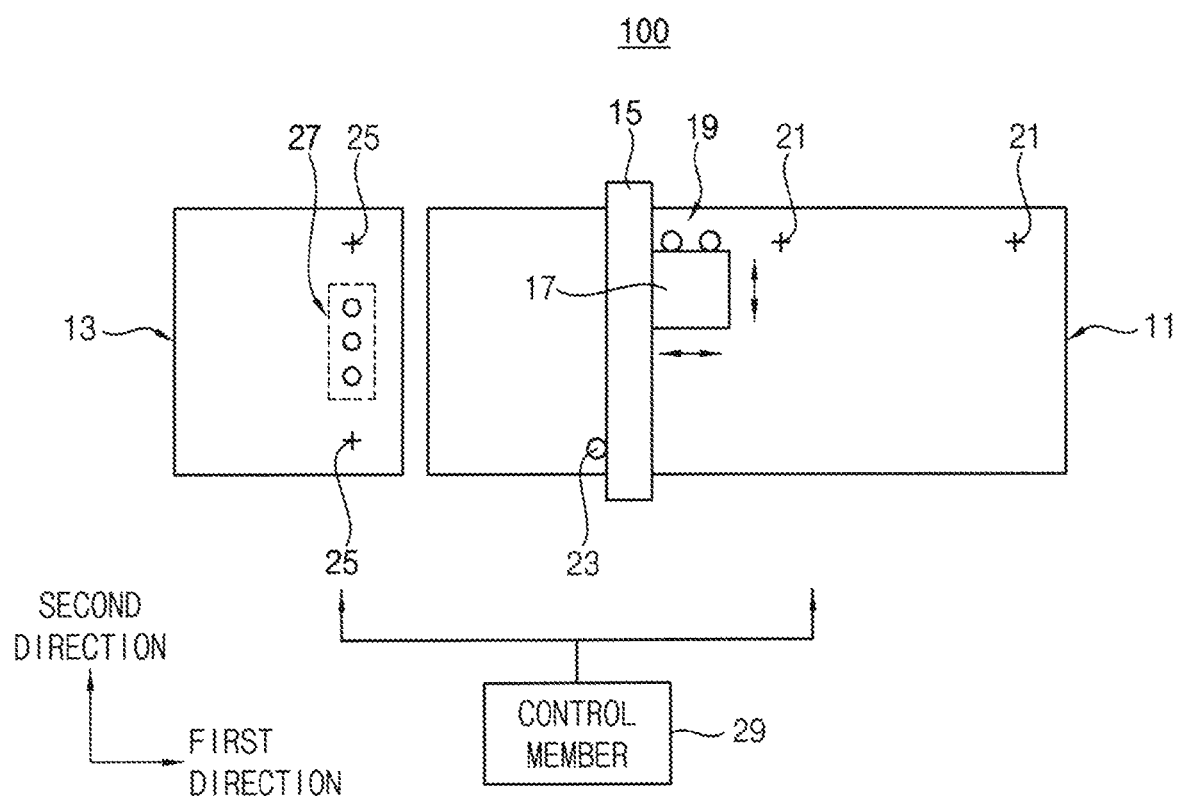
FIG. 1 illustrates a schematic configuration of an ink jet printing system in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, ink jet printing systems according to example embodiments will be described with reference to the accompanying drawings.

FIG. 1 illustrates a schematic configuration of an ink jet printing system in accordance with example embodiments of the invention.

Referring to FIG. 1, an ink jet printing system 100 according to example embodiments may include a printing section 11, a testing section 13, a gantry 15, an ink jet head 17, a first identification member 19, a second identification member 23, a control member 29, etc.

The printing section 11 may be disposed in a first direction relative to an object to be treated such as a substrate. A printing process of supplying chemical liquid onto an object such as a substrate using the ink jet head 17 may be performed in the printing section 11 (hereinafter, in the printing section 11, the substrate may also be referred to as a first substrate).

The ink jet printing system 100 may include a first alignment mark 21 disposed in the printing section 11. In example embodiments, the ink jet printing system 100 may include two first alignment marks 21 provided at one side of the printing section 11 along the first direction. In some example embodiments, the ink jet printing system 100 may include a plurality of first alignment marks 21 arranged at the one side of the printing section 11 in the first direction. The plurality of first alignment marks 21 may be spaced apart by substantially identical distances in the first direction. Additionally, the plurality of first alignment marks 21 may be arranged in a substantial line configuration along the first direction.

The ink jet head 17 may include a plurality of nozzles capable of discharging the chemical liquid onto the substrate. The plurality of nozzles of the ink jet head 17 may be arranged in a substantial line by predetermined intervals. Additionally, the ink jet head 17 may include a plurality of piezoelectric elements wherein the number of the piezoelectric elements may substantially correspond to the number of the nozzles. The chemical liquid may be provided onto the substrate from the nozzles of the ink jet head 17 by the operations of the piezoelectric elements. For example, the voltages applied to the piezoelectric elements may be independently controlled such that the amounts of the chemical liquid supplied onto pixel regions of the substrate from the nozzles may be independently adjusted.

The substrate may be transferred into the printing section 11 along the first direction when the printing process for discharging the chemical liquid onto the substrate is performed. The substrate transferred into the printing section 11 may float over a stage (not illustrated) capable of supporting the substrate. For example, the ink jet printing system 100 may include a floating stage for floating the substrate thereover in the printing section 11. Further, the ink jet printing system 100 may include a transfer member (not illustrated) disposed in the printing section 11. The transfer member may hold one side portion or both side portions of the substrate and may transfer the substrate over the floating stage. In this case, the transfer member may include a guide rail and a gripper. The guide rail may locate over the one side portion or both of the side portions of the substrate, and the gripper may move along the guide rail while holding the one side portion or both of the side portions of the substrate.

As illustrated in FIG. 1, the testing section 13 may be adjacent to the printing section 11 and may locate along the first direction where the substrate is transferred. For example, the testing section 13 may be disposed substantially in parallel with the printing section 11. Generally, the ink jet head 17 may be tested in the testing section 13. In addition, the ink jet head 17 may be maintained in the testing section 13.

The ink jet printing system 100 may include a second alignment mark 25 disposed in the testing section 13. In example embodiments, the ink jet printing system 100 may include two second alignment marks 21 provided at one side of the testing section 13 along a second direction. Here, the second direction may be substantially perpendicular to the first direction. In some example embodiments, the ink jet printing system 100 may include a plurality of second alignment marks 21 at the one side of the testing section 13 in the second direction. The plurality of second alignment marks 21 may be separated by substantially identical distances and may be arranged in a substantial line configuration along the second direction. Accordingly, the first alignment mark(s) 21 of the printing section 11 may be substantially perpendicular to the second alignment mark(s) 25 of the testing section 13.

According to example embodiments, discharging points of the chemical liquid discharged onto the substrate may be identified in the testing section 13. To this end, the ink jet printing system 100 may include a floating stage (not illustrated) capable of floating the substrate there over and a transfer member (not illustrated) capable of transferring the substrate over the floating stage, which are disposed in the testing section 13 (hereinafter, in the testing section 13, the substrate may be referred to as a second substrate).

The gantry 15 may hold the ink jet head 17 and may move the ink jet head 17 between the printing section 11 and the testing section 13. The gantry 15 may across the printing section 11 and the testing section 13 along the second direction. In this case, the printing section 11 may have a width substantially the same as a width of the testing section 13. For example, the gantry 15 may move between the printing section 11 and the testing section 13 along the first direction. The gantry 15 may across the printing section 11 and the testing section 13 in the second direction such that the ink jet head 17 may linearly move with the gantry 15 between the printing section 11 and the testing section 13. Additionally, the gantry 15 may move along the first direction whereas the ink jet head 17 may move in the second direction along the gantry 15 and may move the first direction together with the gantry 15.

Referring to FIG. 1, the first identification member 19 may be proximate to the ink jet head 17 in the printing section 11. For example, the first identification member 19 may be fixed to one side of the ink jet head 17. The first identification member 19 may identify the first alignment mark 21. The first identification member 19 may include a camera or an imaging device such as a charge-coupled device (CCD) capable of recognizing the first alignment mark 21.

The first identification member 19 may be aligned with the first alignment mark 21 along the first direction. In some example embodiments, the ink jet printing system 100 may include the two first identification members 19 attached to the side of the ink jet head 17. Here, the two first identification members 19 may recognize the two first alignment marks 21 while the ink jet head 17 moves in the first direction. In other example embodiments, the ink jet printing system 100 may include the plurality of first identification members 19 in the printing section 11. The plurality of first identification members 19 may identify the plurality of first alignment marks 21 as the ink jet head 19 moves in the first direction.

According to example embodiments, the first identification member 19 may move along the first direction while the ink jet head 17 moves along with the gantry 15 in the first direction. Additionally, the first identification member 19 may move the second direction as the ink jet head 17 moves along the gantry 15 in the second direction. Therefore, the first identification member 19 may identify the first alignment mark 21 in the printing section 11 and also may recognize the second alignment mark 25 in the testing section 13.

As illustrated in FIG. 1, the ink jet printing system 100 may include the second identification member 23 disposed proximate to the gantry 15. For example, the second identification member 23 may be attached to other side of the gantry 15. The second identification member 23 may include a camera or an imaging device such as a CCD capable of recognizing the second alignment mark 25. The second identification member 23 may move along the gantry 15 in the second direction. The gantry 15 may move in the first direction and the second identification member 23 may move in the second direction so that the second identification member 23 may identify the discharging points 27 of the chemical liquid discharged from the ink jet head 17 in the testing section 13. The discharging points 27 in the testing section 13 may be used in the correction of the discharging points of the chemical liquid in the printing section 11 as described below. For example, the discharging points 27 may arranged in one line or in two lines in the testing section 13. In this case, the second identification member 23 may recognize the discharging points 27 arranged in one line or in two lines while the second identification member 23 moves along the second direction in the testing section 13.

The control member 29 may correct the discharging points of the chemical liquid discharged from the ink jet head 17 onto the substrate in the printing section 11 based on the result that the second identification member 23 identifies the discharging points 27 in the testing section 13. In example embodiments of the invention, the control member 29 may control the setting of the position of the first identification member 19 for identifying the first alignment mark 21 and the second alignment mark 25, the setting of the position of the ink jet head 17 based on the identifications of the first alignment mark 21 and the second alignment mark 25, and the setting of the position of the second identification member 23 for identifying the discharging points 27 of the chemical liquid.

The control member 29 may control the setting of the position of the first identification member 19 by the identification of the first alignment mark 21. Based on such setting of the position of the first identification member 19, the control member 29 may identify that the ink jet head 17 exactly locates at a desired position.

The control member 29 may control the setting of the position of the ink jet head 17 in the testing section 13. In some example embodiments, the control member 29 may enable the two first identification members 19 to identify one of the two second alignment marks 25 such that the control member 29 may control the setting of the position of the ink jet head 17 relative to the first direction. In other words, the control member 29 may adjust the position of the ink jet head 17 such that the ink jet head 17 may be arranged in the first direction in the testing section 13. The position of the ink jet head 17 relative to the first direction may be set by moving the gantry 15 along the first direction such that the two first identification members 19 may recognize the one of the two second alignment marks 25.

In some example embodiments, the control member 29 may enable one of the two first identification members 19 to identify the two second alignment marks 25, and thus the control member 29 may control the setting of the position of the ink jet head 17 relative to the second direction. In other words, the control member 29 may adjust the position of the ink jet head 17 such that the ink jet head 17 may be arranged along the second direction in the testing section 13. The position of the ink jet head 17 relative to the second direction may be set by moving the ink jet head 17 along the second direction such that the one of the two first identification members 19 may recognize the two second alignment marks 25.

As described above, the control member 29 may control the ink jet head 17 such that the chemical liquid may be discharged onto the substrate from the ink jet head 17 set at the positions relative to the first and second directions in the testing section 13. In the testing section 13, the discharging points 27 of the chemical liquid may be arranged by the control member 29 in a configuration of a line or two lines.

In example embodiments, the control member 29 may control the second identification member 23 such that the second identification member 23 may identify the discharging points 27 of the chemical liquid in the testing section 13. Then, the control member 29 may correct the discharging points of the chemical liquid supplied onto the substrate in the printing section 11 based on the result that the second identification member 23 recognizes the discharging points 27 of the chemical liquid. Therefore, the ink jet printing system 100 may exactly discharge the chemical liquid from the ink jet head 17 onto the substrate utilizing the correction of the discharging points of the chemical liquid by the control member 29. As a result, the ink jet printing system 100 may exactly provide the chemical liquid onto dense pixel regions of the substrate for manufacturing a display device having a high resolution.

In the ink jet printing system 100 according to example embodiments, the printing processes of providing the chemical liquid onto the substrates may be performed in the printing section 11 and the testing section 13, and the position of the first identification member 19 may be set using the first alignment mark 21. Further, the position of the ink jet head 17 may be exactly set using the first identification member 19 and the second alignment mark 25. Then, the discharging points 27 of the chemical liquid may be identified in the testing section 13, and the discharging points of the chemical liquid discharged onto the pixel regions of the substrate may be exactly corrected in the printing section 11.

According to example embodiments of the invention, the discharging points 27 of the chemical liquid in the testing section 13 may be utilized for the use of test so as to correct the discharging points of the chemical liquid provided onto the pixel regions of the substrate in the printing section 11. The discharging points 27 of the chemical liquid may be arranged in the configuration of the line or two lines in the testing section 13 such that the testing section 13 may have a length substantially smaller than a length of the printing section 11. In this case, the width of the testing section 13 may be substantially the same as the width of the printing section 11. Therefore, the testing section 13 may have a relatively small space to thereby efficiently minimizing the increase of the total space of the ink jet printing system 100 including the printing section 11 and the testing section 13. Further, the gantry 15 may have a length substantially corresponding to the width of the printing section 11 and/or the width of the testing section 13 such that a size of the gantry 15 may be reduced and a downward bending of the gantry may be effectively prevented.

Figure 2:
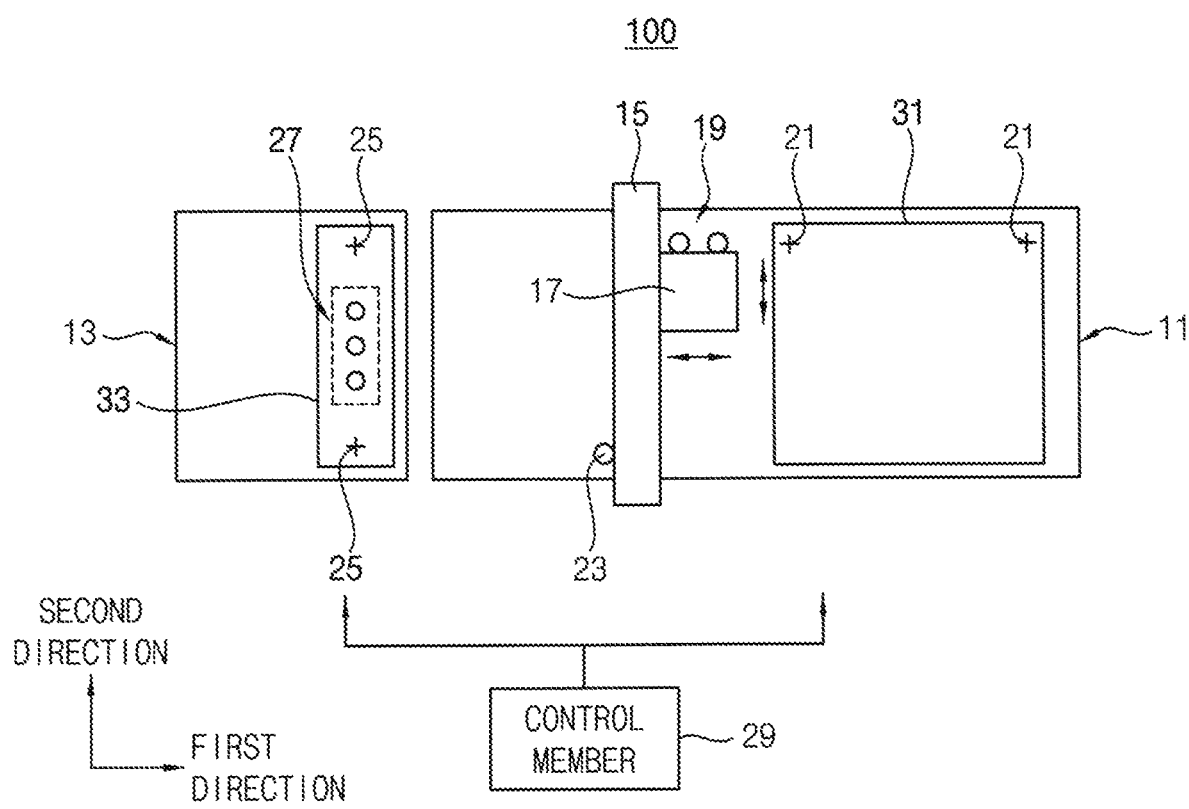
FIG. 2 illustrates a schematic configuration of an ink jet printing system in accordance with some example embodiments of the invention.

FIG. 2 illustrates a schematic configuration of an ink jet printing system in accordance with some example embodiments of the invention. The ink jet printing system 101 illustrated in FIG. 2 may have a configuration similar to that of the ink jet printing system 100 illustrated in FIG. 1 except a first substrate 31 including two first alignment marks 21 and a second substrate 33 including two second alignment marks 25.

Referring to FIG. 2, the first alignment marks 21 may be provided on the first substrate 31 on which the printing process is performed in the printing section 11. The first substrate 31 may be transferred along the first direction in the printing section 11. The second alignment marks 25 may be provided on the second substrate 33 on which the printing process is performed in the testing section 13. The second substrate 33 may be transferred along the first direction in the testing section 13.

In some example embodiments, the second substrate 33 may have a relatively small side portion in the first direction and a relatively large side portion along the second direction. In other words, the second substrate 33 may have a size on which the chemical liquid may be discharged onto the second substrate 33 with the discharging points 27 in the configuration of the line or the two lines. For example, the second substrate 33 may have a rectangular plate shape.

In other example embodiments, a member for preventing the spread of the chemical liquid may be provided on the second substrate 31 in order to exactly indentify the discharging points 27 of the chemical liquid. For example, the member for preventing the spread of the chemical liquid may include a film composed of an organic material.

In the ink jet printing system 100 illustrated in FIG. 2, the two first alignment marks 21 provided on the first substrate 31 which is transferred in the first direction may be identified in the printing section 11. Therefore, when the two first identification members 19 and the two first alignment marks 21 are arranged in a line, the gantry 15 may maintain a state in which the gantry 15 is fixed in the ink jet printing system 100. Additionally, the two second alignment marks 25 provided on the second substrate 33 which is transferred in the first direction may be identified in the testing section 13 such that the gantry 15 may maintain the state where the gantry 15 is fixed in the ink jet printing system 100 when the two first identification members 19 and one of the two second alignment marks 21 are arranged in a line.

In other example embodiments of the invention, the control member 29 may correct the discharging points of the chemical liquid provided onto the first substrate 31 in the printing section 11 based on the identifications of the two first alignment marks 21 and the two second alignment marks 25 and also the identification of the discharging points 27 of the chemical liquid discharged onto the second substrate 33. After the correction of the discharging points of the chemical liquid is accomplished, the chemical liquid may be discharged onto the first substrate 31 in the printing section 11. Accordingly, the ink jet printing system 100 may exactly provide the chemical liquid onto dense pixel regions of the first substrate 31 for manufacturing a display device having a high resolution.

Those ordinary skilled in the art can understand that the configuration in which the two first alignment marks 21 are provided in the printing section 11 or on the first substrate 31, or the configuration in which the two second alignment marks 25 are provided in the testing section 13 or on the second substrate 33 may be selected as occasion demands.

Figure 3:
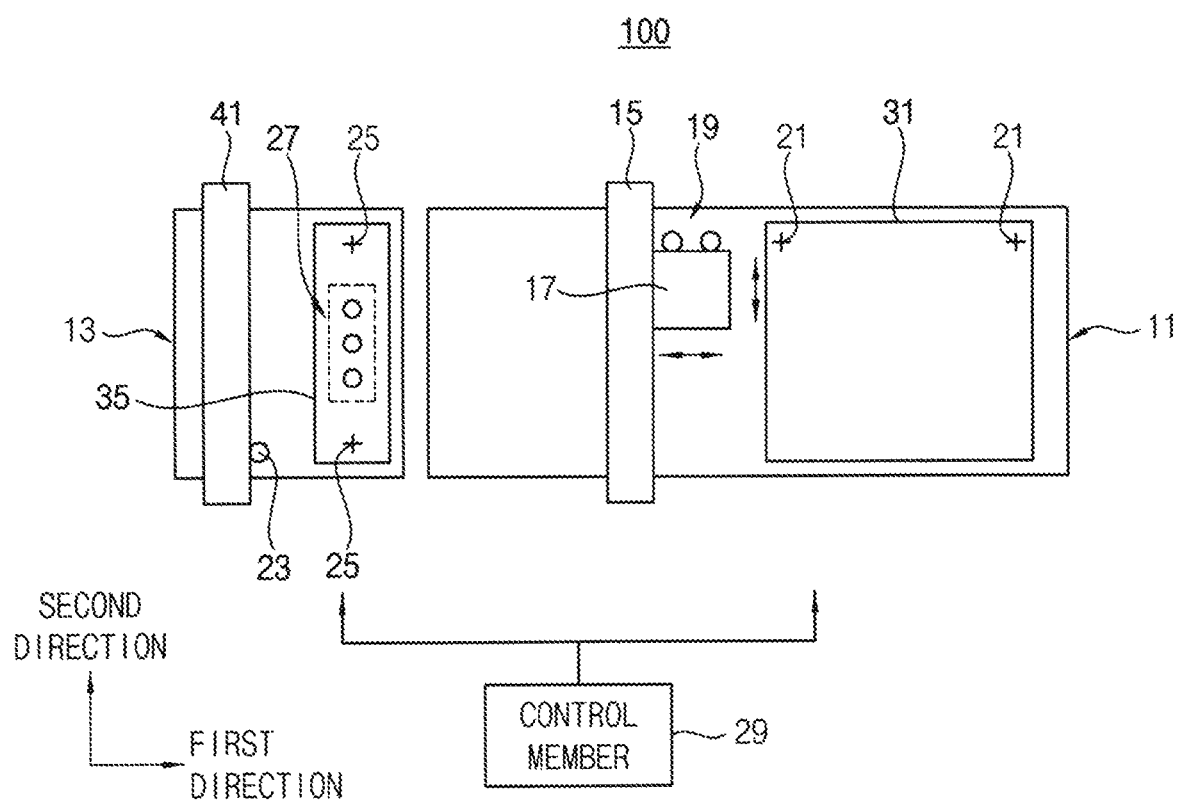
FIG. 3 illustrates a schematic configuration of an ink jet printing system in accordance with other example embodiments of the invention.

FIG. 3 illustrates a schematic configuration of an ink jet printing system in accordance with other example embodiments of the invention. The ink jet printing system 100 illustrated in FIG. 3 may have a configuration similar to that of the ink jet printing system 100 illustrated in FIG. 2 except an auxiliary gantry 41 to which the second identification member 23 is adjacent.

As illustrated in FIG. 3, the second identification member 23 may be attached to one side of the auxiliary gantry 41. The control member 29 may enable the second identification member 23 to identify the discharging points 27 of the chemical liquid on the second substrate 35 in the testing section 13. When the chemical liquid is supplied onto the second substrate 35 in the testing section 13, the auxiliary gantry 41 may move toward the discharging points 27 along the first direction. Further, the second substrate 35 may be moved toward the auxiliary gantry 41 when the chemical liquid is discharged onto the second substrate 35.

In the ink jet printing system 100 according to other example embodiments of the invention, the control member 29 may correct the discharging points of the chemical liquid provided onto the first substrate 31 in the printing section 11 by the identifications of the two first alignment marks 21 and the two second alignment marks 25 and by the identification of the discharging points 27 of the chemical liquid on the second substrate 35. After the correction of the discharging points of the chemical liquid is accomplished, the chemical liquid may be discharged onto the first substrate 31 in the printing section 11. Therefore, the ink jet printing system 100 may exactly provide the chemical liquid onto the dense pixel regions of the first substrate 31 for a display device having a high resolution.

Figure 4:
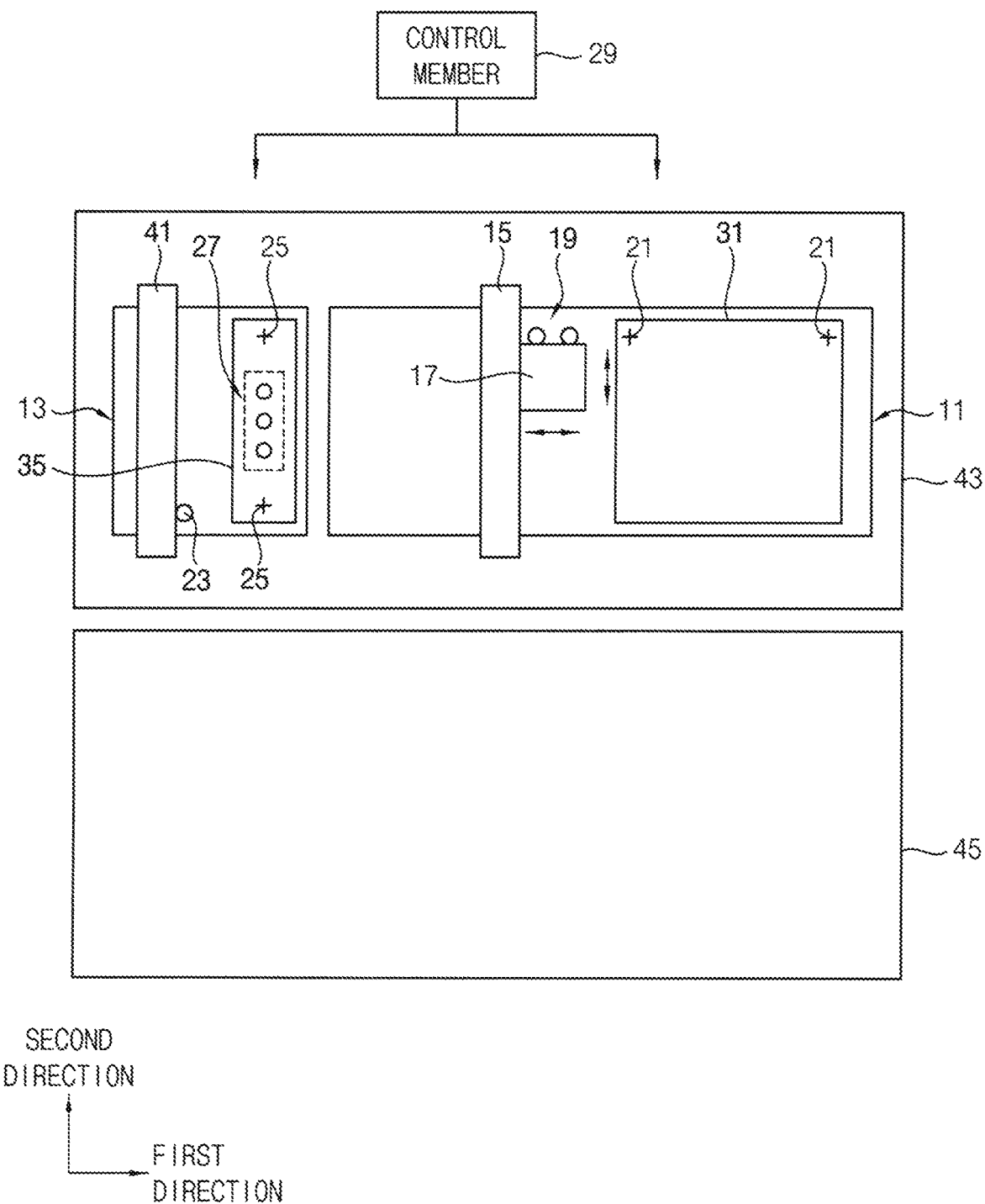
FIG. 4 illustrates a schematic configuration of an ink jet printing system in accordance with still other example embodiments of the invention.

FIG. 4 illustrates a schematic configuration of an ink jet printing system in accordance with still other example embodiments of the invention. The ink jet printing system 100 illustrated in FIG. 4 may have a configuration similar to that of the ink jet printing system 100 illustrated in FIG. 2 except that the printing section 11 and the testing section 13 are disposed on one surface plate 43.

Referring to FIG. 4, the ink jet printing system 100 may have the configuration in which the printing section 11 and the testing section 13 are disposed on the one surface plate 43 whereas the ink jet printing system 100 illustrated in one of FIG. 1 to FIG. 3 has the configuration in which the printing section 11 and the testing section 13 are disposed on separate surface plates, respectively.

In ink jet printing system 100 illustrated in FIG. 4, the identification of the discharging points 27 on the second substrate 35 in the testing section 13 and the correction of the discharging points of the chemical liquid in the printing section 11 may be accomplished on the one surface plate 43. The one surface plate 43 may stably support the printing section 11 and the testing section 13 without any substantial deformation of the one surface plate 43 in comparison with the printing section 11 and the testing section 13 supported by the separate surface plates, respectively. Therefore, the difference between the identification of the discharging points 27 in the testing section 13 and the correction of the discharging points of the chemical liquid in the printing section 11 may be minimized by preventing the deformation of the one surface plate 43 such as distortion. As a result, the ink jet printing system 100 may advantageously employed in manufacturing a display device having a large size with more dense pixels and a high resolution.

In the ink jet printing system 100 according to example embodiments of the invention, the ink jet printing system 100 may further include a maintenance section 45 for maintaining the ink jet head 17 even though the ink jet head 17 may be maintained in the testing section 13. The maintenance section 45 may be disposed adjacent to the printing section 11 and the testing section 13 along the second direction. Therefore, the ink jet head 17 may be more precisely maintained in the maintenance section 45 as well as the testing section 13.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An ink jet printing system including a printing section and a testing section, which comprises:
a first alignment mark disposed in the printing section along a first direction;
a second alignment mark disposed in the testing section along a second direction perpendicular to the first direction;
an ink jet head for providing chemical liquid onto a substrate;
a first identification member proximate to the ink jet head, the first identification member identifying the first alignment mark and the second alignment mark;
a gantry for moving the ink jet head between the printing section and the testing section;
a second identification member proximate to the gantry, the second identification member identifying discharging points of the chemical liquid in the testing section; and
a control member for correcting discharging points of the chemical liquid discharged from the ink jet head onto the substrate in the printing section based on a result that the second identification member identifies the discharging points of the chemical liquid in the testing section,
wherein the testing section is arranged in parallel with the printing section along the first direction.

2. The ink jet printing system of claim 1, wherein the testing section has a width the same as a width of the printing section and the testing section has a length smaller than a length of the printing section.

3. The ink jet printing system of claim 1, wherein the gantry moves in the first direction and the ink jet head moves along the gantry in the second direction.

4. The ink jet printing system of claim 3, wherein the first identification member moves together with the ink jet head in the first direction and the second direction.

5. The ink jet printing system of claim 4, wherein the ink jet printing system includes two first identification members and two first alignment marks, and the two first identification members identify the two first alignment marks as the ink jet head moves in the printing section.

6. The ink jet printing system of claim 5, wherein the ink jet printing system includes two second alignment marks, and the two first identification members identify the two second alignment marks as the ink jet head moves in the testing section.

7. The ink jet printing system of claim 3, wherein the second identification member moves in the second direction along the gantry.

8. The ink jet printing system of claim 7, wherein the ink jet printing system includes two second identification members, and the two first identification members identify the two second alignment marks as the gantry moves in the testing section.

9. The ink jet printing system of claim 1, further comprising a floating stage for floating the substrate and a transfer member for transferring the substrate disposed in each of the printing section and the testing section.

10. The ink jet printing system of claim 1, further comprising an auxiliary gantry moving along the first direction in the testing section wherein the second identification member is proximate to the auxiliary gantry.

11. The ink jet printing system of claim 1, further comprising a maintenance section disposed adjacent to the printing section and the testing section.

12. An ink jet printing system including a printing section and a testing section, which comprises:
    a first alignment mark disposed in the printing section along a first direction;
    a second alignment mark disposed in the testing section along a second direction perpendicular to the first direction;
    an ink jet head for providing chemical liquid onto a substrate;
    a first identification member proximate to the ink jet head, the first identification member identifying the first alignment mark and the second alignment mark;
    a gantry for moving the ink jet head between the printing section and the testing section;
    a second identification member proximate to the gantry, the second identification member identifying discharging points of the chemical liquid in the testing section; and
    a control member controlling a setting of a position of the first identification member for identifying the first alignment mark and the second alignment mark, a setting of a position of the ink jet head based on identifications of the first alignment mark and the second alignment mark, and a setting of a position of the second identification member for identifying the discharging points of the chemical liquid,
    wherein the testing section is arranged in parallel with the printing section along the first direction.

13. The ink jet printing system of claim 12, wherein the ink jet printing system includes two first identification members and two second alignment marks, and the control member enables the two first identification members to identify one of the two second alignment marks, and one of the two first identification members to identify the two second alignment marks such that the control member controls the setting of the position of the ink jet head relative to the first direction and the second direction.

14. The ink jet printing system of claim 12, wherein the control member corrects discharging points of the chemical liquid discharged from the ink jet head onto the substrate in the printing section based on a result that the second identification member identifies the discharging points of the chemical liquid in the testing section.

15. The ink jet printing system of claim 12, wherein the ink jet printing system includes two first alignment marks provided on a first substrate transferred in the printing section along the first direction, and two second alignment marks provided on a second substrate transferred in the printing section along the first direction.

16. The ink jet printing system of claim 15, further comprising a member for preventing a spread of the chemical liquid provided on the second substrate.

17. The ink jet printing system of claim 12, further comprising an auxiliary gantry disposed in the testing section along the second direction wherein the second identification member is proximate to the auxiliary gantry.

18. The ink jet printing system of claim 12, further comprising a maintenance section disposed adjacent to the printing section and the testing section.

19. An ink jet printing system including a printing section and a testing section, which comprises:
    two first alignment marks disposed in the printing section along a first direction;
    two second alignment marks disposed in the testing section along a second direction perpendicular to the first direction;
    an ink jet head for providing chemical liquid onto a substrate;
    two first identification members proximate to the ink jet head, the two first identification members identifying the two first alignment marks and the two second alignment marks;
    a gantry for moving the ink jet head between the printing section and the testing section;
    a second identification member proximate to the gantry, the second identification member identifying discharging points of the chemical liquid in the testing section; and
    a control member controlling a setting of a position of the first identification members for identifying the first alignment marks and the second alignment marks, a setting of a position of the ink jet head based on identifications of the first alignment marks and the second alignment marks, and a setting of a position of the second identification member for identifying the discharging points of the chemical liquid,
    wherein the control member corrects discharging points of the chemical liquid discharged from the ink jet head onto the substrate in the printing section based on a result that the second identification member identifies the discharging points of the chemical liquid in the testing section,
    wherein the testing section is arranged in parallel with the printing section along the first direction, and
    wherein the gantry moves in the first direction and the ink jet head moves along the gantry in the second direction.

20. The ink jet printing system of claim 19, further comprising an auxiliary gantry disposed in the testing section along the second direction; and
    a maintenance section disposed adjacent to the printing section and the testing section,
    wherein the second identification member is proximate to the auxiliary gantry.

* * * * *